United States Patent [19]
Lee et al.

[11] Patent Number: 6,043,167
[45] Date of Patent: Mar. 28, 2000

[54] METHOD FOR FORMING LOW DIELECTRIC CONSTANT INSULATING FILM

[75] Inventors: Young Hie Lee; Dong Sun Kim, both of Cherry Hill, N.J.; Jin Won Park, Chungcheongbuk-do, Rep. of Korea

[73] Assignee: LG Semicon Co., Ltd., Chungcheongbuk-do, Rep. of Korea

[21] Appl. No.: 08/947,503

[22] Filed: Oct. 10, 1997

[30] Foreign Application Priority Data

Oct. 11, 1996 [KR] Rep. of Korea ............ 96/45259

[51] Int. Cl.[7] .................. H01L 21/31; H01L 21/469
[52] U.S. Cl. .................. 438/789; 438/778; 438/783; 438/784; 438/787; 438/789; 438/790; 438/958; 427/255.2; 427/579
[58] Field of Search .................. 438/778, 783, 438/784, 787, 788, 789, 790, 958; 427/255.2, 579

[56] References Cited

U.S. PATENT DOCUMENTS

| | | |
|---|---|---|
| 4,938,995 | 7/1990 | Giordano et al. . |
| 5,302,420 | 4/1994 | Nguyen et al. . |
| 5,334,552 | 8/1994 | Homma ............................ 437/195 |
| 5,413,967 | 5/1995 | Matsuda et al. .................... 437/235 |
| 5,428,102 | 6/1995 | St. Clair et al. . |
| 5,429,995 | 7/1995 | Nishiyama et al. . |
| 5,462,784 | 10/1995 | Grill et al. . |
| 5,462,899 | 10/1995 | Ikeda ................................ 437/238 |
| 5,629,246 | 5/1997 | Iyer ................................. 438/763 |
| 5,661,093 | 8/1997 | Ravi et al. ........................ 438/763 |

OTHER PUBLICATIONS

Kazuhiko Endo and Tordu Tatsumi, Fluorinated amorphous carbon thin films by plasma enhanced chemical vapor deposition for low dielectric constant interlayer dielectrics, Microelectronics Research Laboratories, NEC Corporation, 34 Miyukigaoka, Tsukuba, Ibaraki 305, Japan, pps, 1370–1373.

*Primary Examiner*—John F. Niebling
*Assistant Examiner*—David A. Zarneke

[57] ABSTRACT

The method for forming an insulating film having a low dielectric constant, which is suitable for intermetal insulating film applications, by plasma enhanced chemical vapor deposition (PECVD) includes the step of supplying a first source gas containing fluorine and carbon to a dual-frequency, high density plasma reactor. The method also includes the step of supplying a second source gas containing silicon dioxide to the reactor. In this manner a fluorocarbon/silicon dioxide film is formed on a substrate in the reactor.

12 Claims, 3 Drawing Sheets

F I G.2
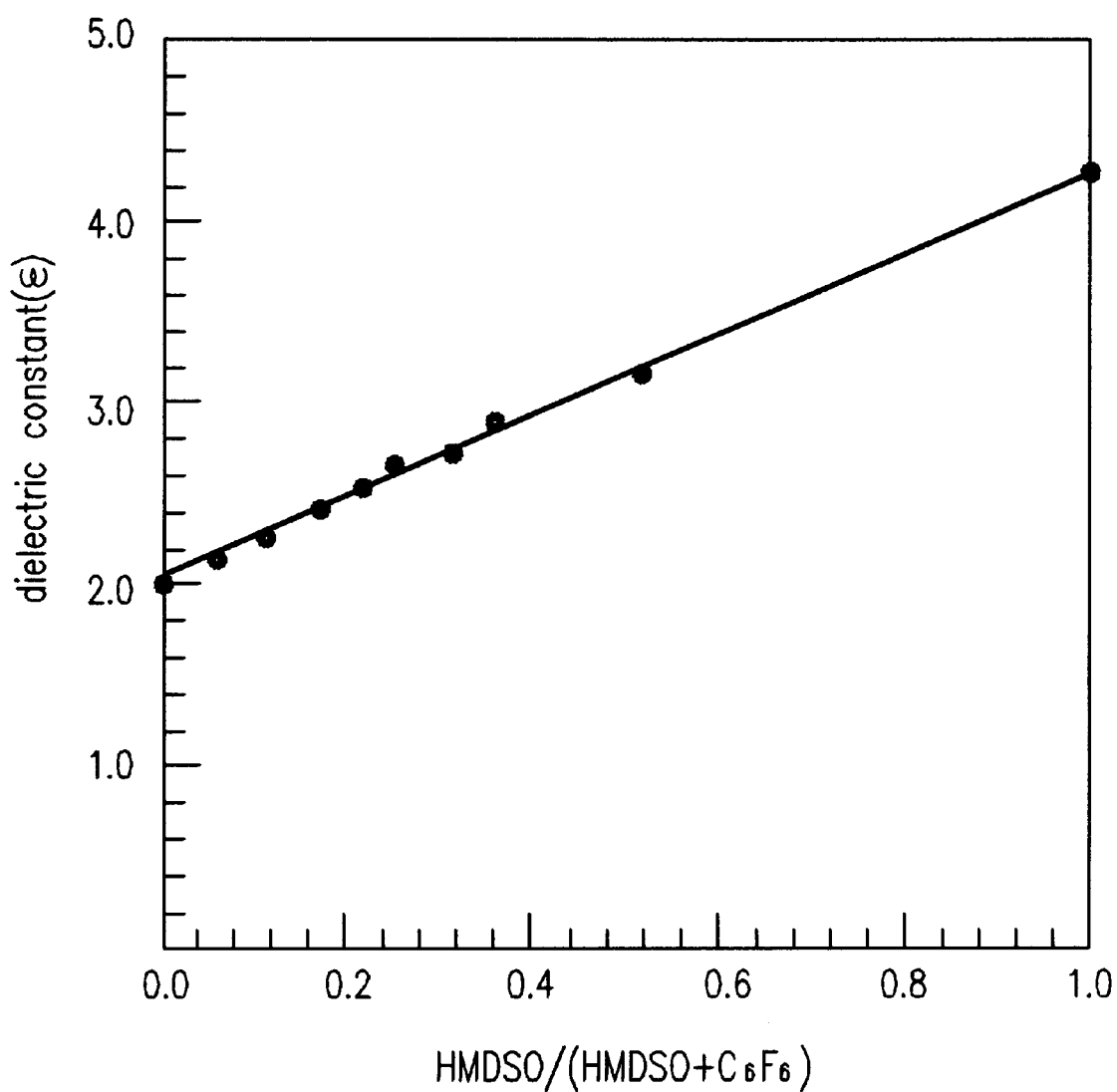

METHOD FOR FORMING LOW DIELECTRIC CONSTANT INSULATING FILM

BACKGROUND OF THE INVENTION

1. Field of the Invention

The present invention relates to a method for forming a thin film and, more particularly, to a method for forming an insulating film having a low dielectric constant, which is suitable for intermetal insulating film applications, by plasma enhanced chemical vapor deposition (PECVD).

2. Discussion of Related Art

With the reduction of the dielectric constant of a thin film in an intermetal insulating film application, the operating speed of a device can be increased in a smaller sized device, and the cross-talk can be decreased. As a result, power consumption can be reduced. To achieve these advantages, resulting from such a reduction of the dielectric constant, various methods for lowering the dielectric constant of an intermetal insulating film have been suggested.

The dielectric constant of a conventional intermetal insulating film (IMD) of silicon oxide ($SiO_2$) is about 4. However, an insulating film of silicon oxide ($SiO_2$) has a disadvantage in that its dielectric constant increases to 10 when the film is exposed to moisture.

An example of a conventional low dielectric constant insulating film is a silicon oxide film containing fluorine.

The dielectric constant of this fluorine-containing silicon oxide ($F_xSiO_y$) film is 3~3.7. In U.S. Pat. No. 5,334,552 to Homa et al. Homa et al. disclose a method for forming an insulating film having a multi-layered interconnection structure which includes the step of forming a 2 to 3.5 $\mu$m thick fluorine-containing silicon oxide film at a temperature of not higher than 200° C. Another example is U.S. Pat. No. 5,429,995 to Nishiyame et al., in which Nishiyame et al. disclose a method for depositing a low dielectric constant and low hygroscopic fluorine by a plasma chemical vapor deposition method using a source gas containing silicon, oxygen and fluorine.

Further examples of conventional low dielectric constant insulating films are organic polymers having a low polarity molecular structure. Spin-coatable polyimides have dielectric constants in the range of 3.0 to 3.7. For instance, U.S. Pat. No. 5,428,102 discloses that a series of high temperature, low dielectric constant, aromatic polyimides have been developed. One of the challenges when using organic polymers is temperature stability. In current processes involving low dielectric constant insulating films, CVD tungsten is deposited at around 450° C., and annealing is performed at around 400° C. Most of the low dielectric organic polymers, however, cannot withstand such high temperature processing.

Among various organic polymers, fluoropolymers such as polytetrafluoroethylene (PTFE) have by far the lowest dielectric constant. For instance, amorphous PTFE has a dielectric constant of 1.9. However, their low adhesive force, low thermal stability and difficulty of manufacture have hindered their use in microelectronics.

On the other hand, hydrogenated amorphous carbon (a-C:F) films deposited by plasma deposition from hydrocarbon gases have high electric resistivity, good thermal stability due to their highly cross-linked structures, and are easy to manufacture. Endo and Tatsumi (1995), J. Appl. Phys. 78(2), 1955, pp 1370, proposed fluorinated amorphous carbon (a-C:F) thin films, which have both a cross-linking and a PTFE-like structure, as low dielectric constant interlayer dielectrics for ultra large scale integration (ULSI) multilevel interconnections. When the source gas was 94% $CF_4$ and 6% $CH_4$, the thin film on the powered electrode showed a dielectric constant of 2.1. The film showed high stress and required an adhesion layer of 10 nm thick a-C:H. The film shrank to 75% when annealed at 300° C. The leakage current was $10^{-7}$ A/cm$^2$ at 1 MV/cm, and was suppressed to $10^{-8}$ by fluorination.

Another example of a conventional low-dielectric constant, amorphous fluorocarbon film for use as an intermetallic dielectric is U.S. Pat. No. 5,302,420. This patent discloses a plasma-deposited polymeric fluorocarbon film with a dielectric constant of about 2.5 and with a thermal stability of at least 350° C. The film is deposited in an asymmetric electrode type reactor at a pressure in the range of 10 to 180 mTorr and with a self-bias voltage in the range of –50 to –700V. Films with a thickness between 0.05 to 5 $\mu$m could be deposited. The hardness and the thermal stability of the amorphous fluorocarbon film stems from the high bombardment used during the deposition process.

An example of a conventional low dielectric plasma-polymerized fluoropolymer thin film is U.S. Pat. No. 4,938,995. This patent discloses a process for the deposition of a low dielectric constant(in the range of 2.3 to 3.3) fluoropolymer thin film using oxygen-containing fluoropolymers as the source monomer.

Another example of a conventional low dielectric constant insulating film is a fluorinated diamond-like carbon film disclosed in U.S. Pat. No. 5,462,784. This patent discloses an improved wear-resistant protective coating for the surface of recording devices that is formed of fluorinated diamond-like carbon. The films are prepared by plasma enhanced chemical vapor deposition on a negatively biased substrate from mixtures of fluorinated hydrocarbons with hydrogen; preferably from fluorinated hydrocarbons with a large ratio of fluorine to carbon in the molecule such as hexafluorobenzene ($C_6H_6$) and pentafluorobenzene ($C_6HF_5$).

Conventional low dielectric constant insulating films have the following problems. First, the films are not stable at temperatures exceeding 350° C. Second, the films deposited using high ion bombardment have severe internal stress which makes them unsuitable for device fabrications. For example, variations of fluorocarbon moieties were obtained at temperatures ranging from 20~700° C. The fluorocarbon films consisting of $CF_3$, $CF_2$, CF and C—$CF_x$ bonds were found to be stable up to approximately 200° C. and to be pyrolyzed via dissociation of the thermal bonds above this temperature.

SUMMARY OF THE INVENTION

One object of the present invention is to provide a method for forming a low dielectric constant insulating film that substantially obviates one or more of the problems due to limitations and disadvantages of the related art.

To achieve these and other advantages, and in accordance with the purpose of the present invention, as embodied and broadly described, the method for forming a low dielectric constant insulating film includes the step of supplying a first source gas containing fluorine and carbon and a second source gas containing silicon dioxide to a dual-frequency, high density plasma reactor to form a fluorocarbon/silicon oxide composite film on a substrate located in the reactor.

The low dielectric constant insulating film of the present invention, which is a fluorocarbon/silicon oxide composite film formed in a dual-frequency, high density plasma reactor, is thermally stable at least to 450° C., has a dielectric constant in a range of 2 to 4, and has low internal stress.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings.

In the drawings:

FIG. 2 is a graph showing dielectric constants of low dielectric constant insulating films of the present invention as a function of a feed monomer gas ratio.

DETAILED DESCRIPTION OF THE PREFERRED EMBODIMENT

Reference will now be made in detail to the preferred embodiments of the present invention, examples of which are illustrated in the accompanying drawings.

Figure 1:
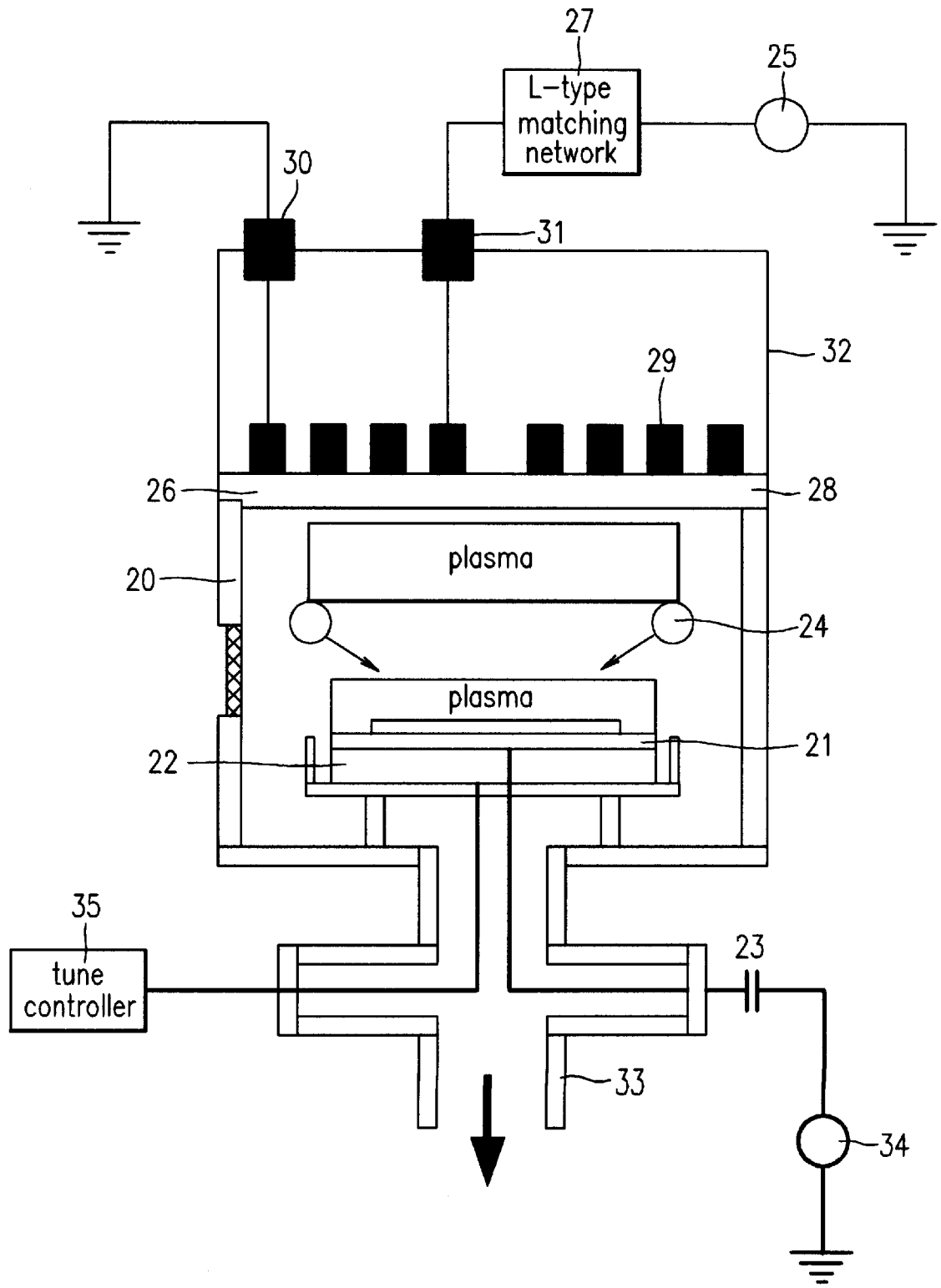
FIG. 1 illustrates a schematic diagram showing an apparatus for forming an insulating film according to the present invention.

Referring to FIG. 1, a substrate is placed into a dual-frequency, high density plasma reactor. The substrate is preferably formed of thermally stable materials, such as potassium chloride, quartz or glass, silicon, metals, ceramics, or polymers. The substrate is also chemically cleaned prior to insertion into the reactor. The reactor is then supplied with argon gas at a rate of 15 SCCM, and the reactor pressure is set at 50 mTorr. The RF modulator power to a bottom electrode is turned on and the power is raised until the bias voltage reaches −300V. The reactor is run for 10 minutes to clean the surface of the substrate. The RF modulator power is then turned off and the reactor is evacuated to its base pressure by a vacuum pump.

The reactor includes a vacuum chamber 20 that can be constructed of stainless steel and should be vacuum tight. Inside the reactor is a substrate holder 21 that is maintained at a constant temperature by a heater 22. The heater 22 is controlled by a temperature controller 35. The substrate holder 21 is supplied with a low frequency signal by a first RF modulator 34 whose excitation frequency can be varied between 10 KHz to 100 KHz. The low frequency power is supplied to the substrate holder 21 through a low impedance blocking capacitor 23. A source gas is provided into the reactor and distributed through a ring-shaped distributor 24 disposed above the substrate holder 21.

A separate, high frequency signal, preferably 13.56 MHz, from a second RF modulator is supplied to a top plate 26 of the reactor through a matching network 27. The top plate 26 has two Pyrex or quartz glass plates having a total thickness in a range of ¾ to 1 inch. Between the two glass plates there is a Faraday shield plate 28 having a radially-spoked (like spokes in a bicycle's wheel) copper plate. This Faraday shield plate 28 reduces capacitive coupling by attenuating divergent rf dielectric fields (i.e., capacitive fields) while allowing divergent free electromagnetic fields (i.e., induction fields) to pass. The Faraday shield plate 28 also dissipates heat.

An antenna 29 sits on the top plate 26, and includes a water-cooled copper tube making four turns on the top plate 26. The high frequency signal is supplied to a center tap 31 of the copper tube while the other tap 30 is grounded. The antenna 29 is housed in a shield box 32, and the source gas is supplied into the vacuum chamber 20 through a vacuum coupling 33.

After the chamber 20 has reached the base pressure by means of a combination of a mechanical pump and a high vacuum pump, such as a turbomolecular pump or diffusion pump, argon and oxygen gases are introduced into the vacuum chamber 20 in the ratio of one to one. The flow rates of each of the gases is set at 10 SCCM.

The temperature of the substrate is set at a desired temperature between 60° C. and 350° C. by means of the temperature controller 35 and the heater 22. After the set temperature is stabilized, the flow rates of the two source gases are adjusted to desired levels. The preferred fluorocarbon source gas is perfluorobenzene ($C_6F_6$) and the preferred $SiO_2$ source gas is hexamethyldisiloxane (HMDSO). The flow rate ratio of the two monomer source gases, i.e., HMDSO/(HMDSO+$C_6F_6$) can be between 0.01 and 0.99 depending on the desired properties of the film, such as dielectric constant and the film stress. In the present invention, flow rates of the source gases are preferably set to be at 12.6 SCCM for perfluorobenzene and at 1.4 SCCM for HMDSO.

After the flow rates of the two source gases are stabilized, the pressure of the reactor is set to 200 mTorr by means of a pressure controller (not shown). As the two source gases are in a liquid state at room temperature, appropriate flow delivery systems each having a liquid heater(to obtain a desirable pressure) and a metering valve or a flow controller have to be used.

After the pressure is stabilized, a 13.56 MHz RF signal is applied to the top electrode, the tope plate 26, by means of the second RF modulator 25, the matching network 27, the center tap 31 and the antenna 29. The power of the 13.56 MHz signal is adjusted to 300W. A 100 KHz RF signal is applied to the bottom electrode, the substrate holder 21, by means of the first RF modulator 34 and the blocking capacitor 23. At this time, the 100 KHz RF signal applied to the bottom electrode is adjusted until the dc bias voltage at the bottom electrode (measured by an oscilloscope or a dc voltage meter having a rf blocking filter) indicates −200V. To appropriately adjust the dc bias voltage applied to the bottom electrode, the bias voltage of the bottom electrode may be in a measured range of −50 to −400V and the total pressure of the reactor may be in a range of 50 to 200 mTorr.

The measurement of a deposition time begins at the time when the dc bias voltage indicates −200V. After the expiration of a desired time to form a desired thickness of fluorocarbon/silicon oxide on the substrate, both the first and second RF modulators 34 and 25 are turned off, and the reactor is evacuated to its base pressure before the reactor is shut down.

With the above-described method, the low dielectric constant insulating film of fluorocarbon/silicon oxide of the present invention is formed on the substrate. The substrate on which the fluorocarbon/silicon oxide composite film is deposited can be moved or stationary.

Next, the dielectric constant, film thickness and infrared spectra of the substrate taken out from the reactor are measured. The infrared spectrum of a film formed according to the present invention and deposited on a potassium chloride disc having a diameter of 13 mm is measured with a Perkin-Elmer Fourier transform infrared (FTIR) spectrometer using a transmission mode with 2 $cm^{-1}$ resolution. To improve the signal-to-noise ratio of the measurement, more than 50 scans are averaged for each sample.

The refractive index and the thickness of the fluorocarbon/silicon oxide composite film deposited on a substrate of 2 inches are measured with an ellipsormeter. The thickness values of the fluorocarbon/silicon oxide composite film may be confirmed with a profilometer.

The dielectric constant of the film is measured with a capacitance-voltage (C-V) plotter. To carry out the C-V measurement, metal-insulator-silicon (MIS) capacitors are formed by sputter-depositing aluminum dot electrodes on the fluorocarbon/silicon oxide composite film deposited on a silicon wafer. The capacitors are positioned on a probing station and connected by wires to the CV-bridge. The C-V testing is then conducted on the MIS capacitors by sweeping the voltage from −100 to +100V at room temperature and at a ramping rate of 0.5V/sec. The capacitance values obtained from more than ten Al dots are averaged to obtain a statistically significant value. Under these conditions, the dielectric constant measured ranged between 2.0 and 4.0.

The deposition rate of the fluorocarbon/silicon oxide composite film of the present invention is influenced by pressure, energy, bias voltage, temperature of the substrate and the like. And, the deposition rate of the insulating film having a low dielectric constant of the present invention is about 0.5~1.5 $\mu$m/hr.

The thermal stability of the deposited film is evaluated by heating the substrate with the film on it in a 100 mTorr vacuum in an argon gas environment. The temperature is first held at 350° C. for one hour and then cooled to room temperature. After the completion of required measurements discussed below, the sample is annealed again for 1 hour at 400° C. The annealing temperature is then increased by 50° C. and maintained for one hour. The required measurements are then made. This is repeated until a final annealing temperature of 500° C. is reached. After each annealing period, the dielectric constant, the thickness of the film, the refractive index and the FTIR spectrum are measured. The thermal stability measurements for the fluorocarbon/silicon oxide composite film according to the present invention showed that the film had its deposited thickness decreased by 2%, refractive index decreased by 1%, and no significant changes in FTIR spectra.

The stress of the deposited fluorocarbon/silicon oxide composite films formed by the process according to the present invention are evaluated by using a Sebastian Stress Gage. The stress is calculated based on the measurement of the curvature of the substrate before and after the deposition of the film. The fluorocarbon/silicon oxide composite films are typically deposited under low compressive stress in the range of $10^7$ to $10^3$ dyne/cm$^2$, and it is preferable to form the intermetal insulating film under a low pressure, less than $10^9$ dyne/cm$^2$. The fluorocarbon/silicon oxide composite film in accordance with one preferred embodiment of the present invention having a thickness of 1 $\mu$m has a stress of $4.8*10^8$ dyne/cm$^2$. When the thickness is 2 $\mu$m, the film has a stress of $4.0*10^7$ dyne/cm$^2$. The stress measured is all compressive.

Referring to FIG. 2, the fluorocarbon/silicon oxide composite film formed according to the present invention has a dielectric constant in a range of 2.0 to 4.0 depending on composition ratios of HMDSO to $C_6F_6$ (i.e., according to the mixture of source gases HMDSO and $C_6F_6$, that is various values of HMDSO/(HMDSO+$C_6F_6$).

Figure 3:
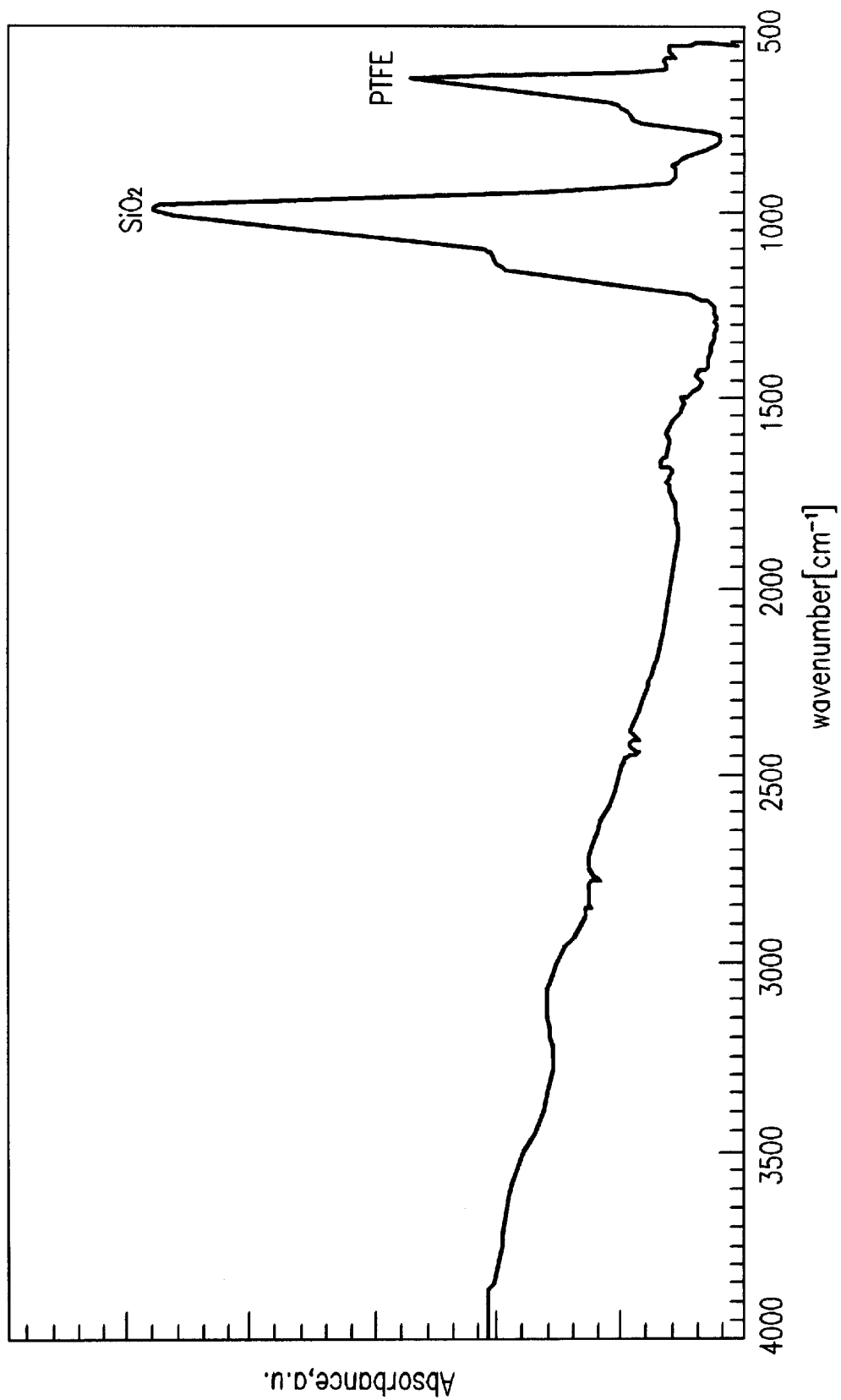
FIG. 3 is a graph showing absorbances of an insulating film of the present invention as a function of wavelength.

Referring to FIG. 3, the infrared spectrum of the fluorocarbon/silicon oxide composite film according to the present invention shows two distinctive absorption bands. One absorption band corresponds to SiO2 at a wave number of around 1070 cm$^{-1}$ and the other absorption band corresponds to a-PTFE at a wave number of around 740 cm$^{-1}$. The size of the absorption band changes depending on the ratio of the source gases, and the two absorption bands represent a property index of the fluorocarbon/silicon oxide composite film.

The fluorocarbon/silicon oxide composite film of the present invention can be used as an intermetal insulating film and as an insulating film for coating material particularly when thermal stability at high temperatures, low resistance and low dielectric constant are required.

It will be apparent to those skilled in the art that various modifications and variations can be made in the method for forming an insulating film of the present invention without departing from the spirit or scope of the invention. Thus, it is intended that the present invention cover the modifications and variations of this invention provided.

What is claimed is:

1. A method for forming a low dielectric constant insulating film comprising:

supplying a first source gas containing perfluorobenzene ($C_6F_6$) to a dual-frequency, high density plasma reactor; and supplying a second source gas containing silicon dioxide to the reactor to form a fluorocarbon/silicon oxide composite film on a substrate located in the reactor.

2. A method as claimed in claim 1, wherein the second source gas includes hexamethyldisiloxane (HMDSO).

3. A method as claimed in claim 1, wherein a flow rate of the first source gas is 12.6 SCCM and a flow rate of the second source gas is 1.4 SCCM.

4. A method as claimed in claim 1, wherein a ratio of the second source gas to a sum of the first, and second source gases is 0.01 to 0.99.

5. A method as claimed in claim 1, wherein a dielectric constant of the fluorocarbon/silicon oxide composite film is in the range of 2.0 to 4.0.

6. A method as claimed in claim 1, wherein a temperature of the substrate in the reactor is in a range of 60° C. to 350° C. and the bias voltage of the substrate is in a range of −50V to −400V during formation of the fluorocarbon/silicon oxide composite film.

7. A method as claimed in claim 1, wherein the substrate is formed of one of silicon, metals, ceramics, glass, polymers and potassium chloride.

8. A method as claimed in claim 1, wherein a pressure in the reactor is in a range of 50 to 200×10$^{-3}$ Torr.

9. A method for forming a low dielectric constant insulating film, comprising:

(a) providing a dual-frequency, high density plasma reactor;

(b) placing a substrate within said reactor; and (c) supplying a first source and second source gas to form a fluorocarbon/silicon oxide composite film on said substrate, said first gas containing perfluorobenzene ($C_6F_6$), and said second source gas containing silicon dioxide.

10. A method as claimed in claim 9, wherein said step (a) provides said reactor having a top electrode and a bottom electrode; and further comprising:

(d) supplying a high frequency signal to said top electrode; and (e) supplying a low frequency signal to said bottom electrode.

11. A method as claimed in claim 10, wherein said step (d) supplying a signal having a frequency of 13.56 MHz as said high frequency signal.

12. A method as claimed in claim 10, wherein said step (e) supplies a signal having a frequency of between 10 KHz and 100 KHz inclusive as said low frequency signal.

* * * * *